US012340856B2

(12) United States Patent
Khitun

(10) Patent No.: US 12,340,856 B2
(45) Date of Patent: Jun. 24, 2025

(54) MAGNONIC ACTIVE RING MEMORY AND LOGIC

(71) Applicant: The Regents of the University of California, Oakland, CA (US)

(72) Inventor: Aleksandr Khitun, Long Beach, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 124 days.

(21) Appl. No.: 18/037,951

(22) PCT Filed: Nov. 22, 2021

(86) PCT No.: PCT/US2021/060371
§ 371 (c)(1),
(2) Date: May 19, 2023

(87) PCT Pub. No.: WO2022/109405
PCT Pub. Date: May 27, 2022

(65) Prior Publication Data
US 2023/0410927 A1    Dec. 21, 2023

Related U.S. Application Data

(60) Provisional application No. 63/117,407, filed on Nov. 23, 2020.

(51) Int. Cl.
*G11C 21/00* (2006.01)
*G11C 11/16* (2006.01)
(Continued)

(52) U.S. Cl.
CPC .......... *G11C 21/005* (2013.01); *G11C 11/161* (2013.01); *B82Y 25/00* (2013.01);
(Continued)

(58) Field of Classification Search
CPC .............. G11C 11/161; G11C 11/1659; G11C 11/1675; G11C 11/5607; G11C 21/005; B82Y 25/00
(Continued)

(56) References Cited

U.S. PATENT DOCUMENTS 8,558,571 B2 * 10/2013 Behin-Aein ........... H03K 19/16
326/104
11,635,456 B2 * 4/2023 Ofek ..................... G01R 23/16
702/66
(Continued)

FOREIGN PATENT DOCUMENTS

WO    WO-2017178704 A1    10/2017
WO    WO-2022109405 A1    5/2022

OTHER PUBLICATIONS

International Application Serial No. PCT/US2021/060371, International Search Report mailed Feb. 11, 2022, 2 pgs.
(Continued)

*Primary Examiner* — Ly D Pham
(74) *Attorney, Agent, or Firm* — SCHWEGMAN LUNDBERG & WOESSNER, P.A.

(57) ABSTRACT

An electronic device and associated methods including magnonic and electronic circuitry are disclosed. In one example, an array of magnonic elements are interconnected to form a network of spin wave paths, and an electronic pathway is connected to the network of spin wave paths to form a ring circuit.

7 Claims, 6 Drawing Sheets

(51) Int. Cl.
   *B82Y 25/00*    (2011.01)
   *G11C 11/56*    (2006.01)
(52) U.S. Cl.
   CPC ....... *G11C 11/1659* (2013.01); *G11C 11/1675* (2013.01); *G11C 11/5607* (2013.01)
(58) Field of Classification Search
   USPC .......................................................... 365/76
   See application file for complete search history.

(56) References Cited

U.S. PATENT DOCUMENTS

| | | | |
|---|---|---|---|
| 11,971,464 B1* | 4/2024 | Nwokoye | ........ G01R 33/34053 |
| 2007/0109147 A1 | 5/2007 | Fukuzawa et al. | |
| 2007/0259209 A1 | 11/2007 | Slavin et al. | |
| 2018/0068703 A1 | 3/2018 | Khitun | |
| 2022/0122755 A1* | 4/2022 | Han | ........................ H03H 1/00 |

OTHER PUBLICATIONS

International Application Serial No. PCT/US2021/060371, Written Opinion mailed Feb. 11, 2022, 7 pgs.
Balinskiy, et al., "A spin-wave magnetometer with a positive feedback", Journal of Magnetism and Magnetic Materials 514, (Jun. 2, 2020), 1-4.

* cited by examiner

MAGNONIC ACTIVE RING MEMORY AND LOGIC

CLAIM OF PRIORITY

This application is a U.S. National Stage Filing under 35 U.S.C. 371 from International Application No. PCT/US2021/060371, filed on Nov. 22, 2021, and published as WO 2022/109405 A1 on May 27, 2022, which claims the benefit of priority to U.S. Provisional Patent Application No. 63/117,407, filed on Nov. 23, 2020, each of which is incorporated by reference herein in its entirety.

TECHNICAL FIELD

Embodiments described herein generally relate to electronic device for storing or processing information.

BACKGROUND

The size of databases is growing exponentially due to the rapid development of Big Data techniques. Internet of Things (IoT), and Bioinformatics. It is desired to have technology for parallel read-out and processing with high speed, aid low power. It is desired to have devices and methods that address these concerns, and other technical challenges.

DESCRIPTION OR EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

The size of databases is growing exponentially due to the rapid development of Big Data techniques. Internet of Things (IoT), and Bioinformatics. In 2018, data centers storage capacity stands at 1450 exabytes worldwide and is expected to reach 380 exabytes by 2021. Data centers based on magnetic storage technology have proved to be the core platforms for cloud computing and Big Data storage. The hard disk drives sold in 2018 had an annualized failure rate (a measure of the estimated probability that the drive will fail during a full year in use) of less than 0.5% and a mean time before failure of more than 2 million hours, based on hard disk drive specs from Seagate Technology and Western Digital Corporation. These facts explain the increasing demand in magnetic data storage devices. There are a permanent development and improvement of the read-in and read-out processes aimed at minimizing power consumption and increasing speed. Spin-transfer-torque magnetoresistive random-access memory (STT-MRAM) is an example of a novel emerging nonvolatile memory. All magnetic storage devices can be classified as either sequential access memory or random access memory. For instance, in order to read-out one bit in magnetic tape, the tape should be winding and the reading head placed in contact with the desired bit (sequential access). In contrast, any bit in MRAM can be accessed immediately at any given time. Regardless of the access process, the existing magnetic memory devices including magnetic tape, hard disk drives, and MRAM inherent one fundamental disadvantage they can read-out only one magnetic bit at a time. This is the major factor limiting the time required for a large magnetic database search. It has already stimulated a search for alternative methods for magnetic bit read-out (e.g., multihead multitrack magnetic memory).

Figure 1A:
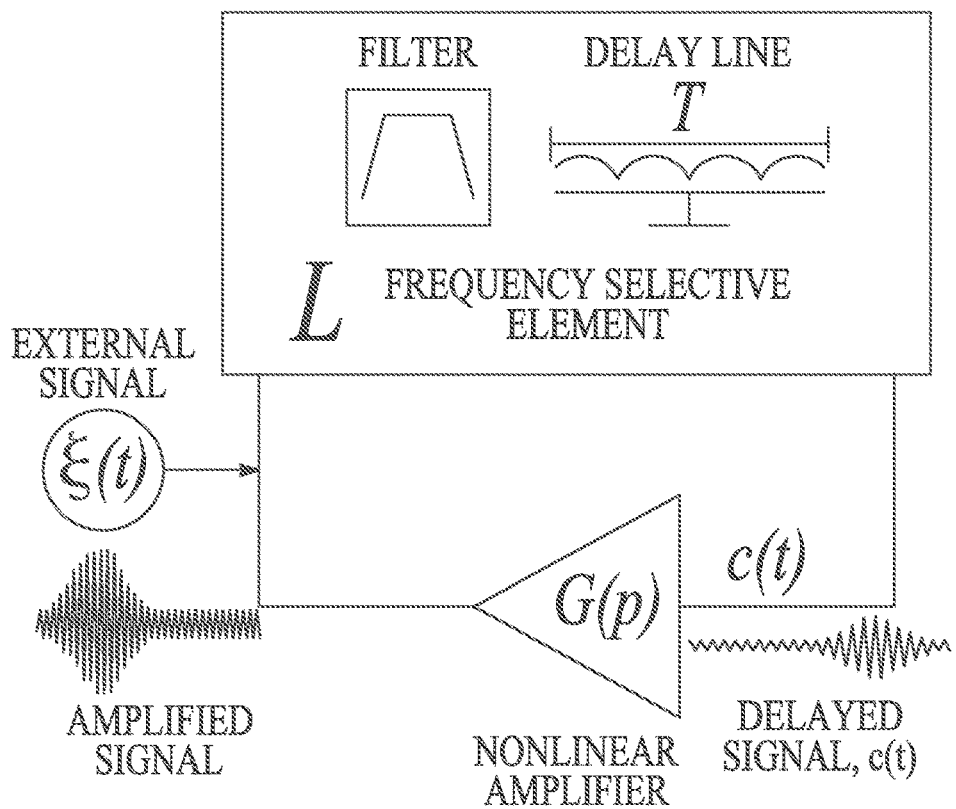
FIG. 1 shows (a) Schematic of an active ring circuit. (b) Transfer function (blue) and mode spectrum (red) of the auto-oscillator. The generation line is shown by filling under the curve. The example of FIG. 1 is shown in accordance with some example embodiments.
Figure 1B:
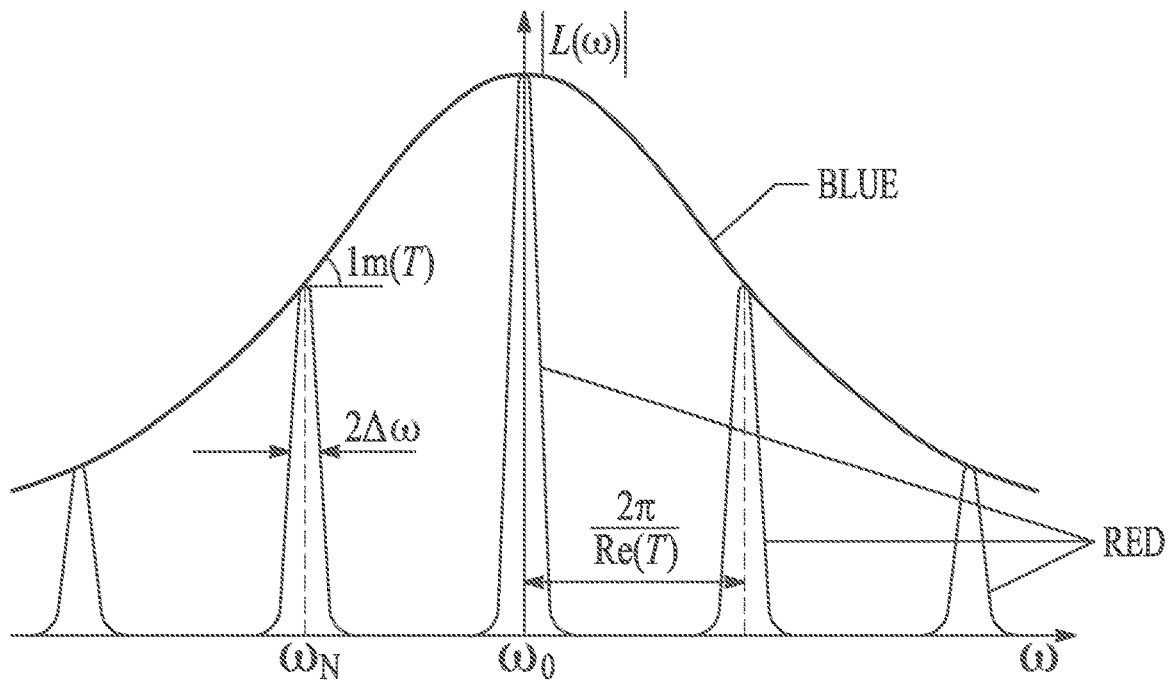

Overall, there is a great need for a novel technology for parallel magnetic bit read-out and processing. Positive feedback spin-wave stems, often termed spin-wave active rings, are used in electronics as coherent microwave sources. The basis far such an active ring is a dispersive spin-wave waveguide with exciting and receiving antennas connected together via a variable gain electrical feedback loop. If the correct gain and phase conditions are met, a monochromatic signal propagates m the ring and increases with time until nonlinear saturation takes place either m the spin-wave system or in the external amplifier. The schematics of the active ring circuit along with its transfer function and frequency spectrum are shown in FIG. 1. The circuit consists of a nonlinear amplifier G(p), an active element, a linear resonance oscillating; system L($\omega$), which may contain an element causing the signal delay. e.g. a spin ware (magnonic) matrix and a source of the relatively weak (compared with the auto-oscillation amplitude) external signal $\xi(t)$, which is a seed signal. The nonlinear active element is described by the function G(p), where p is the oscillation power. It provides the energy flow into the system, while the passive oscillating system L($\omega$) determines the auto-oscillation frequency and provides positive damping. The corresponding operator equation describing such a system has the form:

$$L^{-1}\left(i\frac{d}{dt}\right)c(t) - G(p)c(t) = \xi(t), \quad (1)$$

where the function c(t) describes the complex amplitude of the auto-oscillation at the input, $p=|c(t)|^2$ is the signal power, and the function $\xi(t)$ describes the input driving signal acting on the auto-oscillating loop. The stable limit cycle of the auto-oscillator for the function c(t) has the following form:

$$c_s(t) = \sqrt{P_s} e^{-i\phi(t)}, \quad (2)$$

where $\phi(t) = \omega_s t + \phi_0$, $P_s$ and $\omega_s$ are the stationary free-running auto-oscillation power and frequency, respectively, and $\phi_0$ is an arbitrary initial phase of the auto-oscillation. The gain and phase conditions of the auto-oscillation are the following:

$$abs[L(\omega_s)G(p_s))] \geq 1,$$

$$arg[L(\omega_s)] + arg[G(p_s)] = 2\pi n, \quad (3)$$

The invention offers a new type of memory and logic devices based on active ring circuits. The invention describes a general approach to active ring memory and logic hardware and methods of using this hardware for information storage and logic. The invention is mainly focuses on the application of electro-magnetic (magnonic) circuits comprising magnetic and electronic parts. The same or similar methods can be applied to other types of active ring circuits (e.g., optical, all electrical, magneto-optical, etc.)

Figure 2:
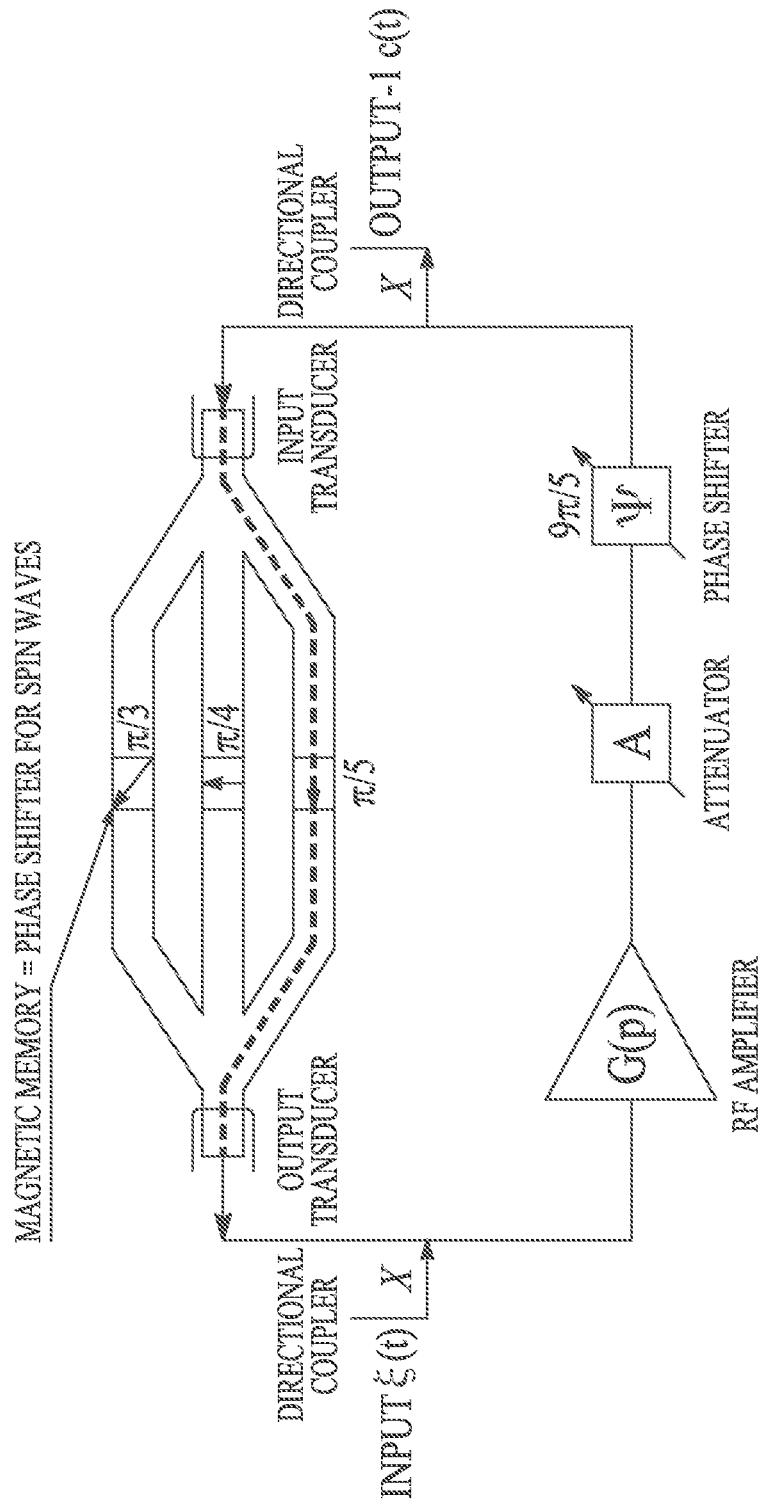
FIG. 2 shows schematics of a ring circuit comprising electric and magnonic parts. The magnonic part has three possible routes for spin wave propagation. According to Eq. (3), the auto-oscillation in the ring circuit may occur if and only if the magnonic part matches the electric part. This property of MAR circuits allows us to search through possible routes by adjusting the electric phase shifter $\Psi$. For instance, spin waves will be excited and amplified only in the route with $\pi/5$ phase shift (red dashed line), which matches the outer electric circuit with phase shift $9\pi/5$. The phase shift depends on the magnet configuration/position on the waveguides. The example of FIG. 2 is shown in accordance with some example embodiments.

In order to explain the main idea of using active ring circuits for memory and logic, we start with a simplified circuit shown in FIG. 2. It combines electric and magnonic parts connected in series to form a closed loop (ring) circuit magnonic active ring (MAR) The electric part includes a narrow-band non-linear amplifier G(p), a controllable attenuator A, and a controllable phase shifter $\Psi$. It is important to use a narrow band amplifier to ensure only one possible frequency $\omega$ for spin wave amplification. The magnonic part is a passive element, a linear resonance oscillating system described by L($\omega$). It comprises a set of magnonic waveguides. For simplicity we depicted just three waveguides. The waveguides are made of a material with low spin wave damping (e.g. $Y_3Fe_2(FeO_4)$ (YIG)).

There am magnets (e.g., Co) placed on the top of the waveguides. These are memory elements where information is encoded in magnetization. There may be more than two thermally stable memory states per magnet. In FIG. 2, there are depicted magnets polarized at different angles with respect to the waveguide. Magnets with different polarizations provide different phase shifts to the spin waves propagating in the waveguides. For example, the magnet oriented at 45 degrees to the waveguide provides a $\pi/3$ phase shift, while the magnets oriented normal and parallel to the waveguides provide $\pi/4$ and $\pi/5$ phase shifts, respectively. There are micro-antennas fabricated on the edges of the waveguides. These antennas convert RF electric signals into spin waves and, vice versa, convert spin wives in RF electric signals.

There are two directional couplers for communication with the outer electrical circuits. One coupler is used for injecting the input seed signal $\xi(t)$ The second coupler is to take a portion of the circuit power c(t) to the output. We define two states of the ring circuit. (i) auto-oscillation is On, and (ii) auto-oscillation is Off. These two states are recognized by the level of the circuit power c(t) (i.e., c(t)»$\xi(t)$ in the On state). According to Eq. (3), the auto-oscillation in the ring circuit starts as soon as the amplification provided by the electric part G(p) compensates the losses in the magnonic part L($\omega$), and the phase shift in the magnonic part+phase shift in the electric part=$2\pi n$. We assume that the electric amplifier provides sufficient power to compensate spin wave losses and the first condition is satisfied. There are three possible routes for the spin waves in the magnonic part shown in FIG. 2. However, there is only one route that matches the electric part. For instance, only one waveguide with $\pi/5$ phase shift will match the electric part with the phase shifter $\Psi-\pi/5$. The trajectory of the excited spin wave is depicted by the red dashed line in FIG. 2. Spin waves propagating through this route will be amplified while spin waves propagating through the other routes will be damped. Thus, spin wave transport inside the magnonic matrix depends on the position of the outer phase shifter. It allows us to switch between the possible routes inside the magnonic part and/or search for the routes which match the electric part of the ring.

Figure 3:
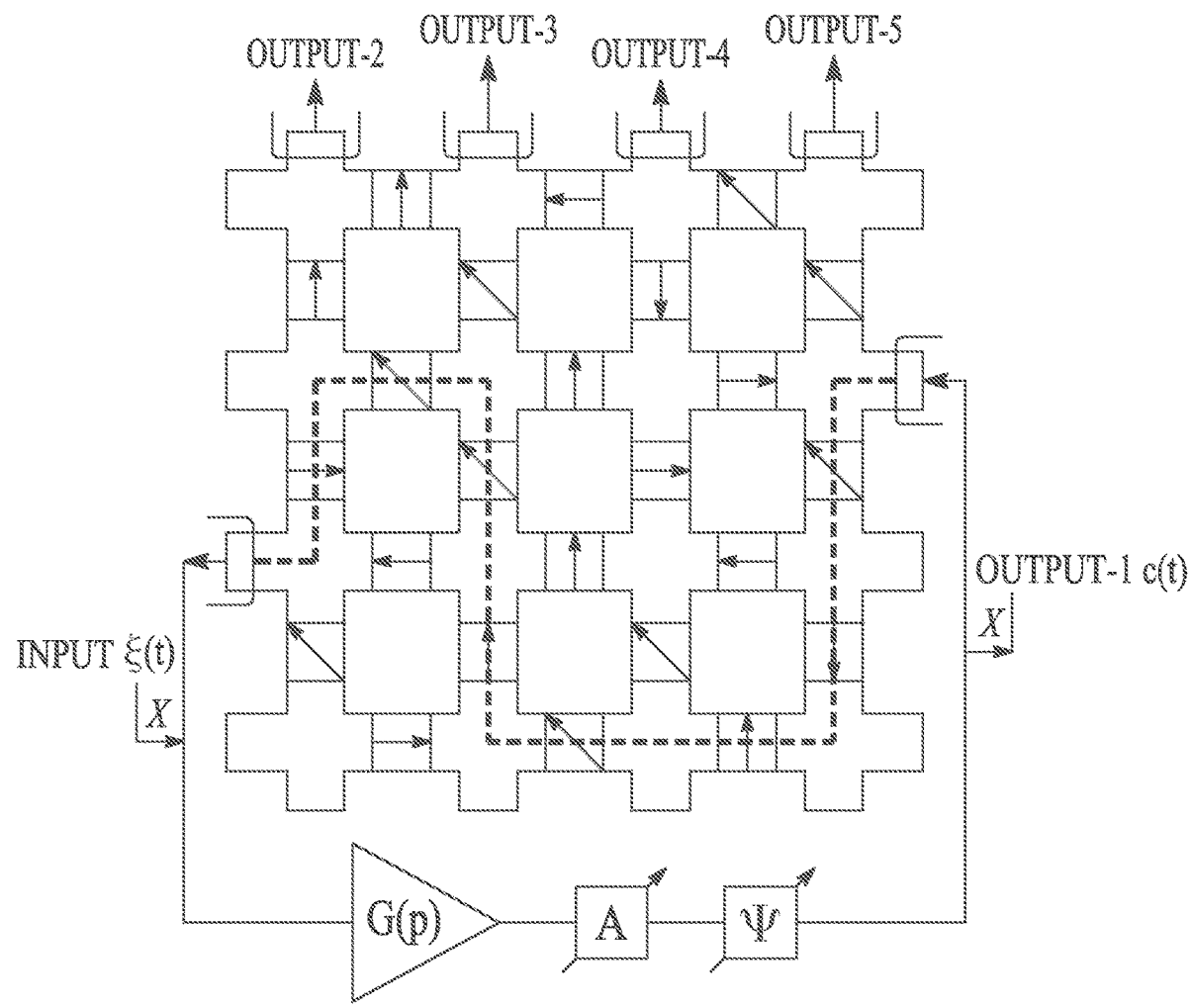
FIG. 3 show schematics of MAR memory circuit. Magnonic part is a mesh of waveguides with magnets placed on top. The magnets are memory elements, where information is encoded m the magnet polarization. There are multiple routes for spin wave; propagation through the matrix. Each route is associated ninth phase shifts and attenuation for the spin wave signal. The circuit is in the On state (auto-oscillation) if there is at least one route to match the electric part. The circuit is in the Off state otherwise. The additional output ports shown on the top will recognize the route in the On state. It is possible to search for a specific spin wave route associated with a number of magnetic bits in one stop b adjusting the outer electric attenuator A and the phase shifter $\Psi$. The example of FIG. 3 is shown in accordance with some example embodiments.

We propose to exploit the coupling between the electric and magnonic parts in MAR circuit for building novel memory and logic devices. The concept of MAR memory circuit is illustrated in FIG. 3. It is shown a circuit similar to one in FIG. 2 but with multiple routes for spin wave propagation in the magnonic matrix. The matrix is a mesh of magnonic waveguides with magnets placed on top of waveguides. As in the previous example, magnets are the memory elements, where information is encoded in magnetic polarization.

Magnets polarized in different directions provide different phase shifts to the spin waves propagating in the waveguides. There are multiple routes for spin wave propagation, where each route is associated with a certain phase shift and the attenuation of the spin wave signal. The phase shift of each route is defined by the polarization of the memory elements while the attenuation is defined by the length of the route. The circuit is in the On state (auto-oscillation) if there is at least one route to match the electric part. The circuit is in the Off state (no auto-oscillation) if there are no routes matching the electric part. There are additional outputs (e.g., Output −2, 3, 4, 5) shown in FIG. 3, which are aimed at recognizing the specific route in the On state.

There are micro-antennas at each output port to concert spin wave signals in the inductive voltage. The amplitude of the output inductive voltage decreases exponentially with the distance from the spin wave route. For example, there is a route shown by the orange curve in FIG. 3. This is the route which matches the outer electric part. Spin waves propagating this route n ill be amplified while spin waves in all other routes will be damped. The output voltage detected by Output-3 and Output-5 will be larger than the one detected by Output-2 and Output-4 by $\exp[\Delta l/\alpha]$, where $\Delta l$ is the propagation length difference to the output, $\alpha$ is the spin wave damping constant (e.g., 3 dB/1 mm at RT for YIG).

The principle of MAR-memory operation is the following. A low-power signal $\xi(t)$ is injected in the circuit by the other RF generator The injection ma, or may not lead to the self-oscillation, depending on the availability of the routes matching the electric part. The circuit is in the Off state if there are no matching routes. The circuit is in the On state if there is at least one route matching the electric part. The inductive voltage collected by the side outputs (2-5) provides information on the specific route in the On state. The number of possible matching routes increases for a higher level of amplification. The number of routes decreases as the attenuation decreases. Using the attenuator, A, one can find the route with minimum propagation length L (i.e., minimum losses), which matches the phase condition in Eq. (3).

Figure 4A:
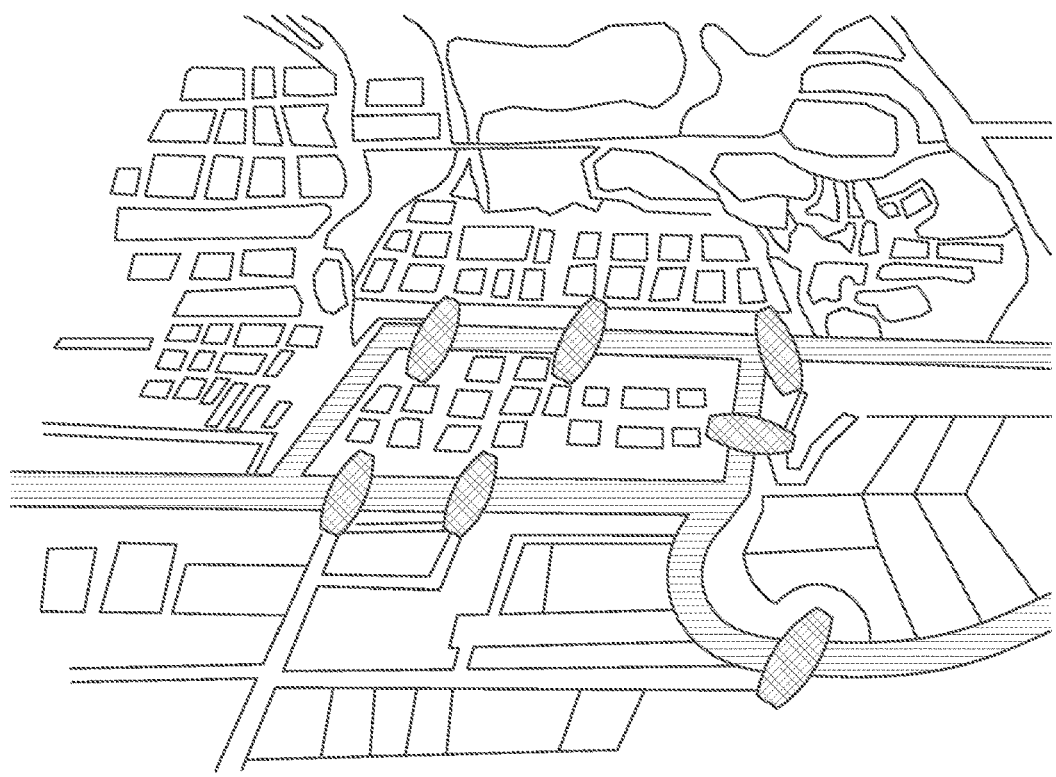
FIG. 4 shows (A) The map of Konigsberg in Euler's time showing the actual layout of the seven bridges. (B) The equivalent magnonic matrix with seven magnets Each of the magnets pros ides a unique phase shift $\pi/k$, where is k is a prime number k 3, 7, 11, 13, 17, 19, 23. The electric phase shifter is setup to $\Psi=2\pi-\Sigma\pi/k$. The auto-oscillation occurs if and only if the spin wave (walker) passes each magnet (bridge) just once. The example of FIG. 4 is shown in accordance with some example embodiments.

The ability to search through magnetic matrix using spin wave routes gives us the intriguing possibility of solving certain types of mathematical problems utilizing parallel database search with MAR devices. For example, we want to describe a possible application of MAR doe ice to the Seven Bridges of Konigsberg problem, a historically notable mathematical problem. Its negative resolution by Leonhard Euler in 1736 laid the foundations of graph theory and prefigured the idea of topology. The city of Konigsberg in Prussia (now Kaliningrad, Russia) was set on both sides of the Pregel River and included two large islands—Kneiphof and Lonise—which were connected to each other, or to the two mainland portions of the city, by seven bridges. The map of Konigsberg in Euler's time showing the actual layout of the seven bridges, highlighting the riser Pregel and the bridges is shown in FIG. 4(A). The problem was to devise a walk through the city that would cross each of those bridges once and only once. It is a non-trivial mathematical problem which may take significant amount of computation to a general type processor by checking all possible routes one by one.

Figure 4B:
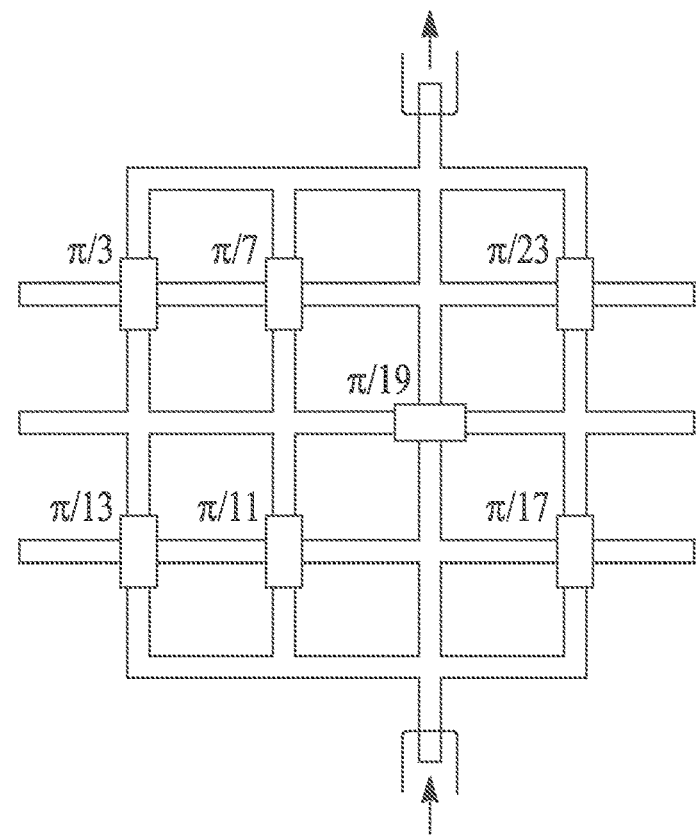

This problem can be mapped well to the MAR circuit as shown in FIG. 4(B). It is depicted as a matrix with seven magnets. These magnets symbolize the bridges between the input and the output Each magnet provides a unique phase shift to the propagating spin wave. We chose the phase shifts to be $\pi/k$, where is k is a prime number k=3, 7, 11, 13, 17, 19, 23. The electric phase shifter is set as follows: $\Psi=2\pi-\Sigma\pi/k$. In this scenario, the auto-oscillation occurs if and only if the spin wave (walker) passes each magnet (bridge) just once. It is also possible to find the distance travelled by varying the level of signal attenuation. In this example, the MAR circuit accelerates NP problem solution via parallel search through all possible routes. It takes about 100 ns for spin waves to propagate through a 1 mm long waveguide (the typical group velocity of micrometer long magnetostatic spin waves in YIG is about 104 m/s). It takes about 10-1000 rounds of propagation (1 μs|1 ms) until the amplitude of the amplified spin wave signal reaches its saturation There may be an enormous number of possible routes in 1 mm×1 mm magnonic matrix with 10 μm wide waveguides. In general, the time required for spin wave propagation scales linearly with the geometrical size of the matrix while the number of possible routes increases factorially assuming a constant waveguide density.

Figure 5:
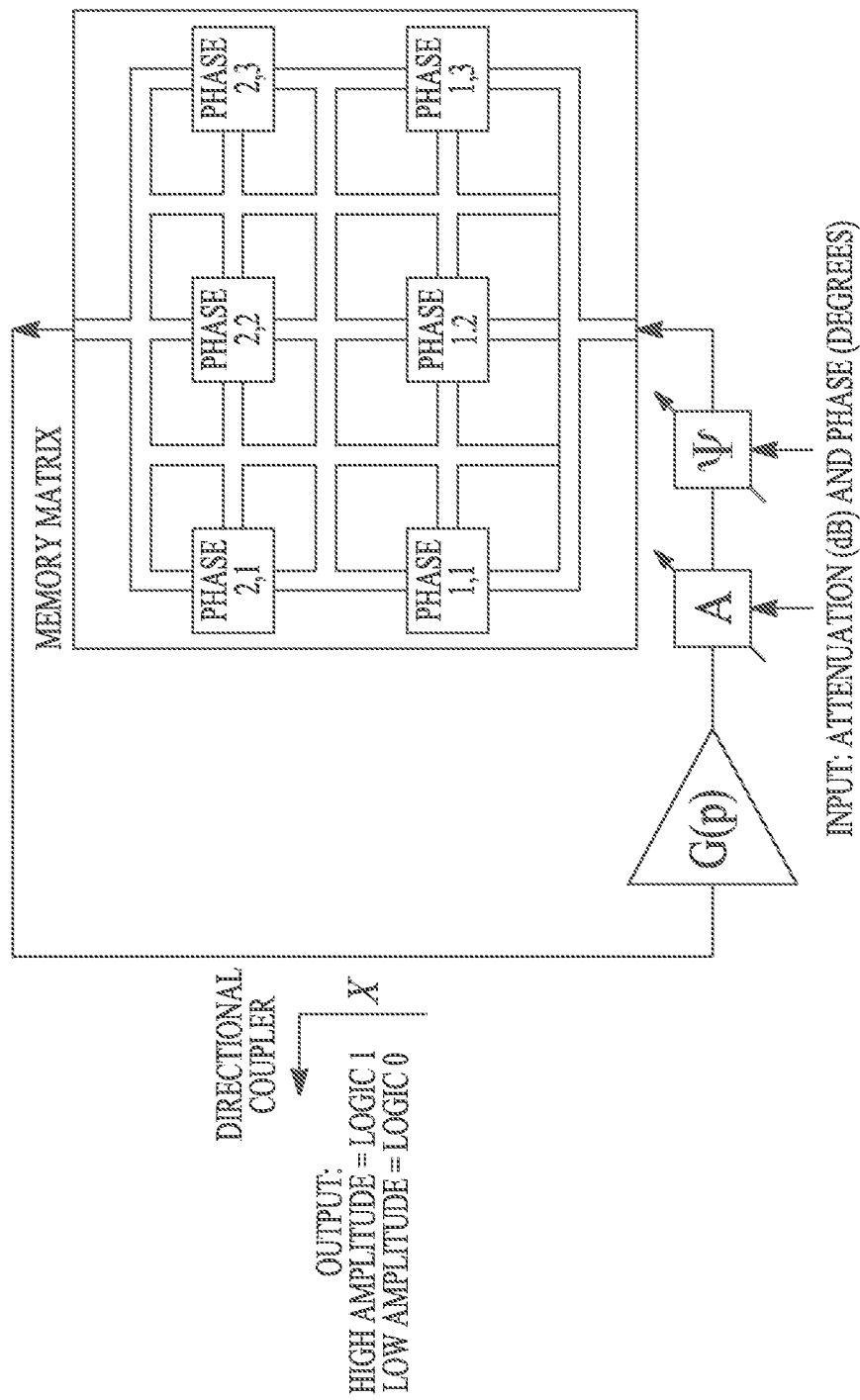
FIG. 5 shows general schematics of active ring memory and logic device. It consists of a narrow-band nonlinear amplifier G(p), a controllable attenuator A, a controllable phase shifter $\Psi$, and a memory matrix. The memory matrix consists of a mesh of wires (e.g., waveguides) and a set of phase shifters. The information in the matrix is stored in the number of routes connecting the input and the output, where each route is associated with some attenuation and phase delay. Input information is encoded in the level of attenuation of the controllable attenuator A and the phase of the controllable phase shifter $\Psi$. The auto oscillations in the circuit occur if and only if conditions of Eq. (3) are met for amplitude and phase. A small portion of the circuit power is transmitted to the output circuit. Output logic 0 and 1 correspond to the amplitude of the signal. The functionality of the circuit is to provide parallel search though a number of possible routes (memory states) to see whether or not there is a match to the input amplitude and phase.

The described above approach to magneto-electric active ring memory and logic circuits can be extended to other types of active ring circuits. In general schematics are shown in FIG. 5. It is shown a circuit consisting of a narrowband non-linear amplifier G(p), a controllable attenuator A, a controllable phase shifter $\Psi$, and a memory matrix. The memory matrix consists of a mesh of wires (e.g., waveguides) and a set of phase shifters. The information in the matrix is stored in the number of routes connecting the input and the output, where each route is associated with some attenuation and phase delay.

The principle of operation is the following. Input information is encoded in the level of attenuation of the controllable attenuator A and the phase of the controllable phase shifter $\Psi$. The auto oscillations in the circuit occur if and only if conditions of Eq. (3) are met for amplitude and phase. A small portion of the circuit power is transmitted to the output circuit. Output logic 0 and 1 correspond to the amplitude of the signal. The functionality of the circuit is to provide parallel search through a number of possible routes (memory states) to see whether or not there is a match to the input amplitude and phase.

The proposed technique can be applied to special task data processing. An example of the Seven Bridges of Konigsberg problem is described above. It is also possible to apply the proposed circuits for other NP problems. Here we describe a method of using proposed circuit for prime factorization. The phase shifters in FIG. 5 can be designed to correspond to the logarithms of primes (e.g., Phase 1,1=ln(3). Phase 1,2=ln(5), Phase (1,3)=ln(7), etc). The input phase is setup to be $\Psi=2\pi-\ln(N)$, where N is the number to be factorized. The circuit will automatically find a route (if one exist) to match the phase condition of Eq. (3).

$$\Sigma Phases+(2\pi-Log(N))=2\pi,$$

$$\Sigma \log(primes)=\ln(N). \qquad (4)$$

The route consists of all the primes for given N. Multiplying these primes (i.e. adding logarithms) one obtains N. The factorization is via the parallel search through all possible combinations.

Figure 6:
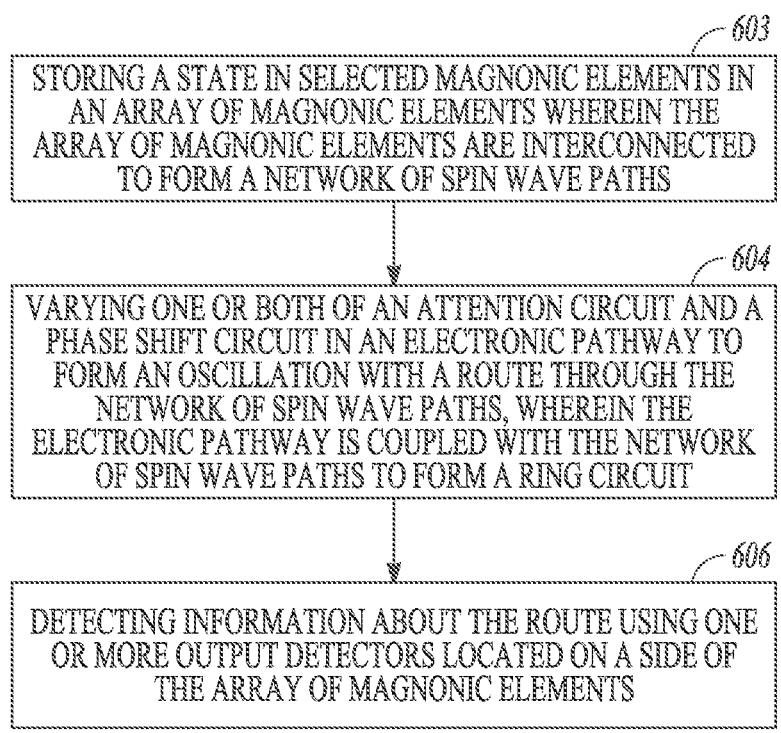
FIG. 6 shows an example flow diagram of a method of operating an electronic device in accordance with some example embodiments.

FIG. 6 shows an example method of operating an electronic device, according to one embodiment. In operation 602, a state is stored in selected magnonic elements in an array of magnonic elements wherein the array of magnonic elements are interconnected to form a network of spin wave paths. In operation 604, one or both of an attention circuit and a phase shift circuit is vaned in an electronic pathway to form an oscillation with a route through the network of spin wave paths, wherein the electronic pathway is coupled with the network of spin wave paths to form a ring circuit. In operation 604, information about the route is detected using one or more output detectors located on a side of the array of magnonic elements.

To better illustrate the method and apparatuses disclosed herein, a non-limiting list of embodiments is provided here.

Example 1 includes a magnonic active ring device, including an army of magnonic elements interconnected to form a network of spin wave paths, and an electronic pathway, including a phase shift circuit and an attenuation circuit, wherein the electronic pathway is coupled with the network of spin wave paths to form a ring circuit.

Example 2 includes the magnonic active ring device of example 1, further including a number of output detectors located on a side of the array of magnonic elements.

Example 3 includes the magnonic active ring device of any one of examples 1-2, wherein the array of magnonic elements includes an array of magnets that are selectively polarizable.

Example 4 includes the magnonic active ring device of any one of examples 1-3, further including programming circuitry to selectively polarize individual magnets in the array of magnets.

Example 5 includes the magnonic active ring device of any one of examples 1-4, wherein the programming circuitry is configured to accept data in relation to a mathematical problem and to polarize corresponding magnets in the array of magnets to solve the mathematical problem.

Example 6 includes the magnonic active ring device of any one of examples 1-5, further including circuitry to gradually reduce an attenuation in the attenuation circuit until a shortest resonant pathway is identified in the network of spin wave paths.

Example 7 includes the magnonic active ring device of any one of examples 1-6, wherein the number of output detectors are configured to characterize the shortest resonant pathway and to relate a characterization of the shortest resonant pathway to a solution of the mathematical problem.

Example 8 includes a method, including storing a state in selected magnonic elements in an array of magnonic elements wherein the array of magnonic elements are interconnected to form a network of spin wave path, varying one or both of an attenuation circuit and a phase shift circuit in an electronic pathway to form an oscillation with a route through the network of spin wave paths, wherein the electronic pathway is coupled with the network of spin wave paths to form a ring circuit, and detecting information about the route using one or more output detectors located on a side of the array of magnonic elements.

Example 9 includes the method of example 8, wherein storing the state in selected magnonic elements includes storing a selected polarization within a magnet located at intersections within the network of spin wave paths.

Example 10 includes the method of any one of examples, 8-9, wherein storing the selected polarization includes storing an array of selected polarizations within an array of magnets at intersections within the network of spin paths, and when the array of selected polarizations relate to a mathematical problem.

Example 11 includes the method of any one of examples, 8-10, wherein storing the state in selected magnonic elements in the array of magnonic elements includes storing a state in an X-Y grid of spin wave paths.

Example 12 includes the method of any one of examples, 8-11, wherein routes traverse the array in the X-direction, and wherein detecting information about the route using one or more output detectors is performed by detectors in the Y-direction.

Example 13 includes the method of any one of examples, 8-12, wherein detecting information about the route includes processing a stored problem to find one or more solutions.

Example 14 includes the method of any one of examples, 8-13, wherein varying one or both of the attention circuit and the phase shift circuit includes reducing an attenuation to reduce a number of possible routes within the network of spin wave paths.

Example 15 includes the method of any one of examples, 8-14, wherein reducing the attenuation to reduce the number of possible routes includes reducing an attenuation until a single shortest route is identified.

Example 16 includes the method of any one of examples, 8-15, wherein detecting information about the route using one or more output detectors includes identifying a characterization of the shortest route, and wherein the characterization of the shortest route relates to an answer to a mathematical problem.

Example 17 includes the method of any one of examples, 8-16, wherein detecting information about the route includes retrieving stored memory data.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "inventions#" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or#" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first,# "second,# and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a,# "an, # and "the # are intended to include the plural forms as well, unless the context clearly indicates otherwise. It will also be understood that the term "and/or# as used herein refers to and encompasses any and all possible combinations of one or more of the associated listed items. It will be further understood that the terms "comprises # and/or "comprising, # when used in this specification, specify the presence of stated features, integers, steps, operations, elements, and/or components, but do not preclude the presence or addition of one or more other features, integers, steps, operations, elements, components, and/or groups thereof.

As used herein, the term "if# may be construed to mean "when# or "upon# or "in response to determining# or "in response to detecting,# depending on the context. Similarly, the phrase "if it is determined# or "if [a stated condition or event] is detected# may be construed to mean "upon determining# or "in response to determining# or "upon detecting [the stated condition or event]# or "in response to detecting [the stated condition or event].# depending on the context.

The invention claimed is:

1. A magnonic active ring device, comprising:
    an array of magnonic elements interconnected to form a network of spin wave paths; and
    an electronic pathway, including a phase shift circuit and an attenuation circuit, wherein the electronic pathway is coupled with the network of spin wave paths to form a ring circuit.

2. The magnonic active ring device of claim 1, further including a number of output detectors located on a side of the array of magnonic elements.

3. The magnonic active ring device of claim 1, wherein the array of magnonic elements includes an array of magnets that are selectively polarizable.

4. The magnonic active ring device of claim 3, further including programming circuitry to selectively polarize individual magnets in the array of magnets.

5. The magnonic active ring device of claim 4, wherein the programming circuitry is configured to accept data in relation to a mathematical problem and to polarize corresponding magnets in the array of magnets to solve the mathematical problem.

6. The magnonic active ring device of claim 5, further including circuitry to gradually reduce an attenuation in the attenuation circuit until a shortest resonant pathway is identified in the network of spin wave paths.

7. The magnonic active ring device of claim 6, wherein the number of output detectors are configured to characterize the shortest resonant pathway and to relate a characterization of the shortest resonant pathway to a solution of the mathematical problem.

* * * * *